United States Patent
Song et al.

(10) Patent No.: US 7,025,845 B2
(45) Date of Patent: Apr. 11, 2006

(54) SURFACE MOUNTED DEVICE TYPE PACKAGE USING COAXIAL CABLE

(75) Inventors: Il-jong Song, Suwon (KR); Ja-nam Ku, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 111 days.

(21) Appl. No.: 10/247,300

(22) Filed: Sep. 20, 2002

(65) Prior Publication Data
US 2003/0139070 A1  Jul. 24, 2003

(30) Foreign Application Priority Data
Jan. 19, 2002  (KR) .................................. 2002-3192

(51) Int. Cl.
*H01F 41/04* (2006.01)

(52) U.S. Cl. .................................. 156/89.12
(58) Field of Classification Search ................ 439/63; 385/92; 29/600, 830–43, 850; 333/204, 333/206; 174/250–1; 156/89.12
See application file for complete search history.

(56) References Cited

U.S. PATENT DOCUMENTS

| | | | | |
|---|---|---|---|---|
| 4,153,988 A | * | 5/1979 | Doo | 29/827 |
| 5,323,534 A | * | 6/1994 | Iwasaki et al. | 29/850 |
| 6,588,097 B1 | * | 7/2003 | Nishide et al. | 29/832 |

FOREIGN PATENT DOCUMENTS

JP          11-186427 A          7/1999

* cited by examiner

*Primary Examiner*—Ross Gushi
(74) *Attorney, Agent, or Firm*—Sughrue Mion, PLLC

(57) ABSTRACT

A surface mounted device (SMD) package using coaxial cables and a method of manufacturing the SMD by forming green sheets and selecting portions for mounting the coaxial cables on the green sheets and forming holes in the portions selected, stacking and heating the green sheets having the holes, and inserting the coaxial cables into the holes of the green sheets. The SMD includes a device mounting unit formed in the package for mounting a high frequency electronic device which transmits and receives high frequency signals, transmission lines electrically connected to the high frequency electronic device, and the coaxial cables penetrating internal and external portions of the package and including internal lead wires which contact the transmission lines. The SMD package is formed to conveniently transfer high frequency signals without the signal transfer loss.

8 Claims, 5 Drawing Sheets

SURFACE MOUNTED DEVICE TYPE PACKAGE USING COAXIAL CABLE

BACKGROUND OF THE INVENTION

1. Field of the Invention

The present invention relates to a surface mounted device (SMD) type package using coaxial cables and, more particularly, to an SMD type package using more than one coaxial cable for conveniently transferring high frequency signals and for being easily attached to a printed circuit board (PCB).

2. Description of the Related Art

A conventional optical module includes an optical device and a package unit that is electrically connected to the optical device and is used for protecting the optical device. The optical module as a necessary component in an optical communication system, operates as an electric signal to an optical signal (E/O) and to an O/E converter. In detail, the optical module converts the electric signal of a base station, which is an input into master equipment of an optical repeating system, into an optical signal. Subsequently, the optical signal is transferred to slave equipment installed in an area where service is provided through optical cables. There is an increasing demand for optical modules capable of transmitting increasingly larger amounts of data at increasing higher speed. However, the amount of data and speed of its transfer are limited by structural problems of the package which protects the optical device and transfers high frequency signals.

In order for the package of the module to be suitable for the transmission of high frequency signals, it must meet the following conditions: first, the structure has to be simple so that it's members can be manually arranged and positioned at predetermined positions respectively; second, the package has to be conveniently bonded to a PCB to transfer the signals efficiently; third, the package must have a sufficient thermal capacity for minimizing thermal shock to the electronic device caused by internal and external heat of the module; and fourth, automation has to be achieved and a packaging cost, which is the most expensive part of manufacturing the module, has to be low.

A butterfly-type package is commonly used in conventional optical communication. However, the butterfly-type package is limited in its ability to transfer high frequency signals, so various types of alternative packages have been suggested. An example of an alternative package is shown in FIG. 1. In this package, via holes 13 are formed on a package unit 12 for connecting signal transfer lines. Namely, the package unit 12, which is formed of the via holes 13 used for transferring signals and of a ball grid array (BGA) 14 used for bonding the via holes 13 to a PCB, is mounted on an optical device. In this case, the optical device includes a silicon optical bench 11 on which optical components are mounted and a laser diode driver for controlling the optical components. Signals are transferred through the via holes 13, and the BGA bonding is performed under the via holes 13.

The package shown in FIG. 1 has several strengths. The size of the package can be reduced, and the package has a small amount of parasitic capacitance due to very small contact points. Moreover, unlike the butterfly-type package, the bonding is conveniently performed by using the via holes regardless of the number of contact points.

However, when the package using the via holes 13 as shown in FIG. 1 transfers high frequency signals, transfer loss occurs. For that reason, the via holes should be formed to have a smaller diameter. Moreover, the package has to have a sufficiently high thermal capacity for protecting optical devices that are sensitive to temperature. If the thermal capacity of the package is too low, the device inside may fall into a thermal shock.

As described above, the thermal capacity of the package is reduced when the via holes are formed to have a smaller diameter; thereby, the package insufficiently protects the optical device inside. Moreover, in the case of using the via holes, direct current (DC) signals are smoothly transferred, but it is difficult to transfer high frequency signals of higher than 40 GHz, which recently have been demanded by the industry.

SUMMARY OF THE INVENTION

To solve the above-described problems, it is an aspect of the present invention to provide a package with a sufficiently large thermal capacity so as not to be sensitive to external heat, to transfer high frequency signals without a transfer loss, and to be used as various types of high frequency electronic device packages including an optical module.

An apparatus consistent with the present invention relates to a surface mounted device (SMD) type package using coaxial cables, comprising a device mounting unit formed in the package for mounting a high frequency electronic device which transmits and receives high frequency signals, transmission lines electrically connected to the high frequency electronic device mounting unit, and the coaxial cables penetrating internal and external portions of the package and including internal lead wires which contact the transmission lines.

In this case, each of the coaxial cables includes the internal lead wire, a dielectric material formed on the external circumference of the internal lead wire, an external lead wire surrounding the external circumference of the dielectric material for being grounded to the inner surface of the package, and an insulator for coating the external lead wire.

It is preferable that the coaxial cables expose the sections thereof on the external surface of the package or extended to the external surface of the package.

It is preferable that a high frequency electronic device, such as a silicon optical bench, a surface acoustic wave (SAW) filter, a microwave monolithic integrated circuit (MMIC), or a hetero-junction bipolar transistor (HBT), is mounted to the high frequency electronic device mounting unit.

To further solve the above-described problems, it is an aspect of the present invention to provide a method of manufacturing an SMD type package using coaxial cables, comprising the steps of forming green sheets, selecting portions for mounting the coaxial cables on the green sheets and forming holes in the selected portions, stacking and heating the green sheets having the holes, and inserting the coaxial cables into the holes of the green sheets.

To further solve the above-described problems, another aspect of the present invention is to provide a method of manufacturing an SMD type package using coaxial cables, comprising the steps of forming green sheets, selecting portions for mounting the coaxial cables on the green sheets and forming holes in the selected portions, inserting dielectric material and conductive material into each hole on the green sheets, and stacking and heating the green sheets.

BRIEF DESCRIPTION OF THE DRAWINGS

The above aspects and advantages of the present invention will become more apparent by describing in detail an illustrative, non-limiting embodiment thereof with reference to the accompanying drawings, in which.

DETAILED DESCRIPTION OF THE INVENTION

Figure 1:
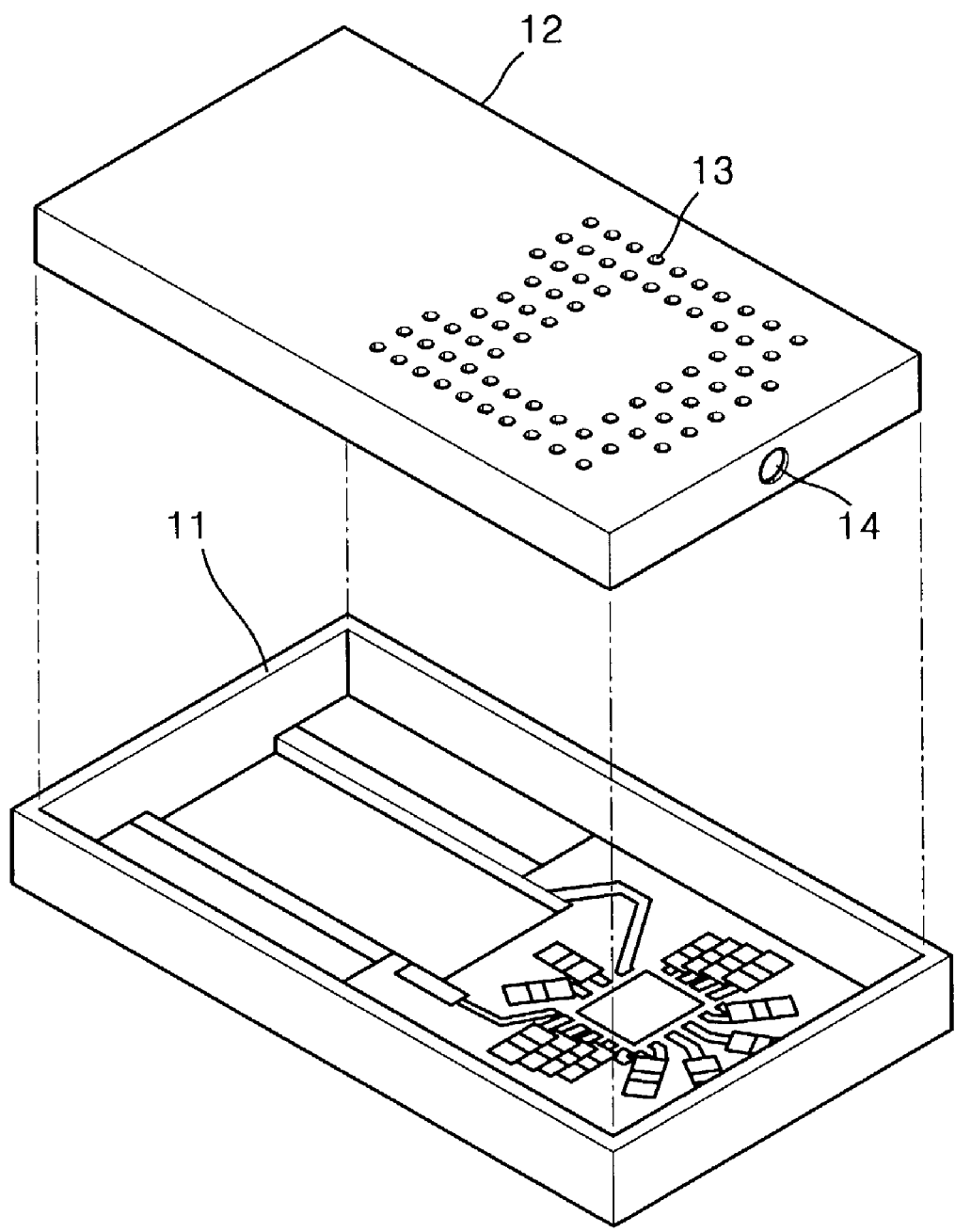
FIG. 1 illustrates a conventional package having via holes.

The present invention will now be described in detail by describing illustrative, non-limiting embodiments thereof with reference to the accompanying drawings. In the drawings, the same reference characters denote the same elements. An optical module according to the present invention includes an optical device and a package in which coaxial cables are used as signal transfer lines.

Figure 2A:
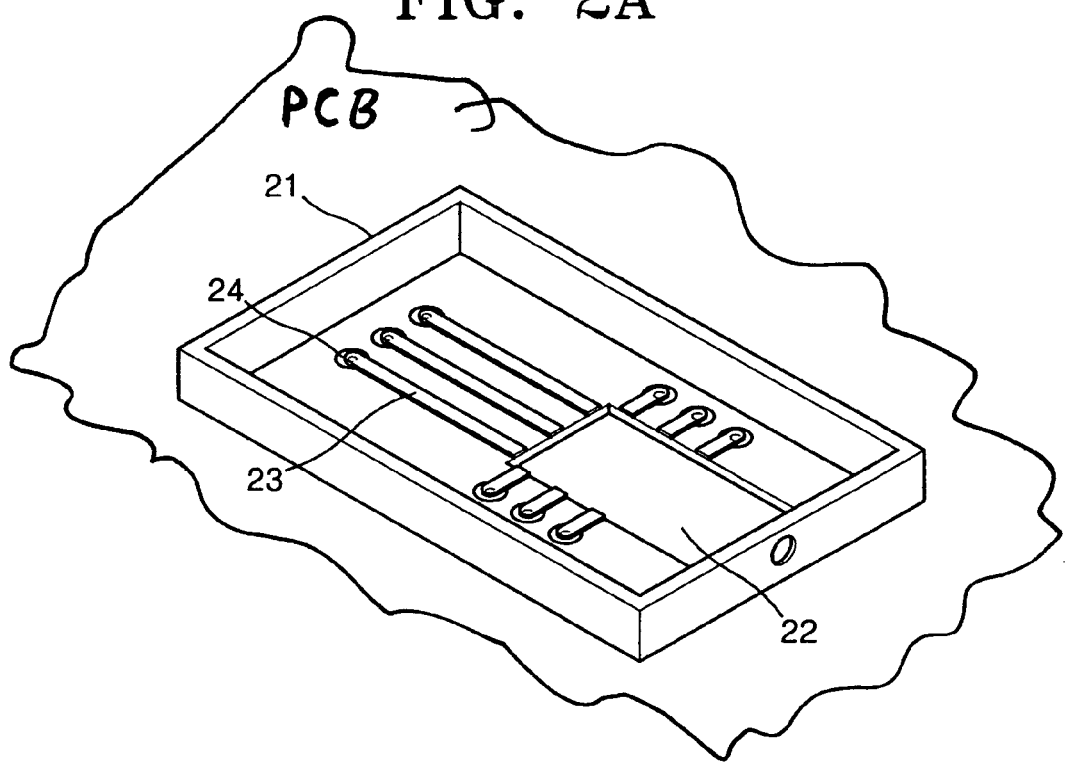
FIG. 2A illustrates a surface mounted device (SMD) type package according to the present invention.

The structure of a surface mounted device (SMD) type package 21 according to the present invention is illustrated in FIG. 2A. The SMD type package 21 according to the present invention includes a device mounting unit 22 on which optical devices of a flat circuit board are located; transmission lines 23, which are electrically connected with the optical devices; and coaxial cables 24 for connecting the transmission lines to the outside.

The SMD type package 21 according to the present invention is applicable to various devices using high frequency signals, including optical devices which transmit and receive optical signals. Accordingly, various types of high frequency transfer devices can be mounted in the device mounting unit 22. In this case, the SMD type package 21 according to the present invention may be used for transferring signals and protecting devices such as a silicon optical bench (SIOB), a surface acoustic wave (SAW) filter, a microwave monolithic integrated circuit (MMIC), and a hetero-junction bipolar transistor (HBT).

Figure 2B:
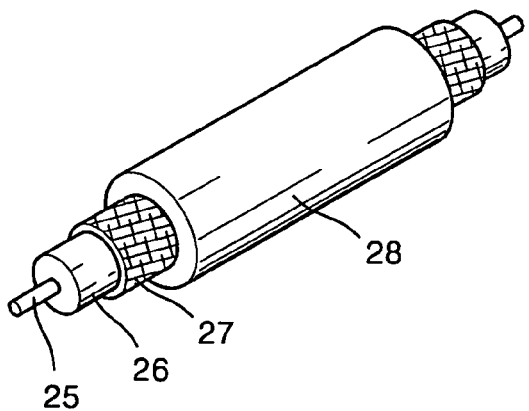
FIG. 2B is a perspective view illustrating a coaxial cable inserted into the SMD type package according to the present invention.

The coaxial cable is formed of an internal lead wire 25, a dielectric material 26 used as an internal insulator, an external lead wire 27, and a coating material 28 as shown in FIG. 2B. The internal lead wire 25 of the coaxial cable is brought into contact with the transmission line, and the external lead wire 27 is connected to a ground conductor on one surface of a printed circuit board (PCB) for being grounded. The coaxial cable may transfer both analog and digital signals. Since the dielectric material 26 is used as the internal insulator, transfer loss caused by interference between the coaxial cables is reduced, thereby transferring high frequency signals well.

Figure 3A:
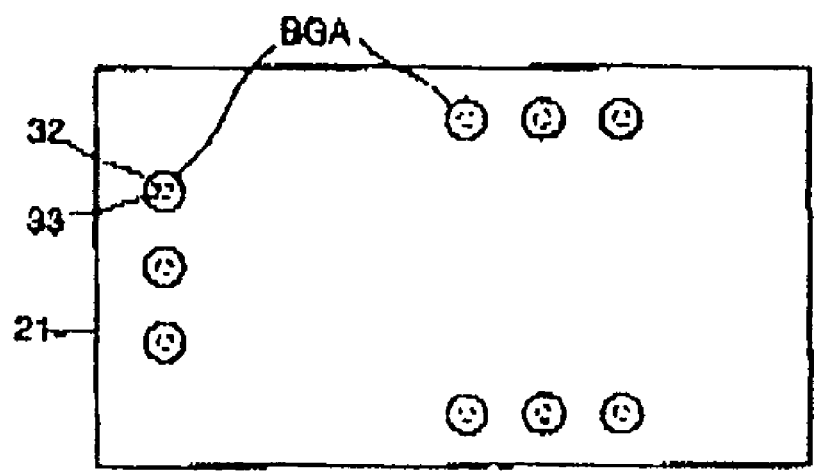
FIG. 3A is an illustrative, non-limiting embodiment of a ball grid array (BGA)
Figure 3B:
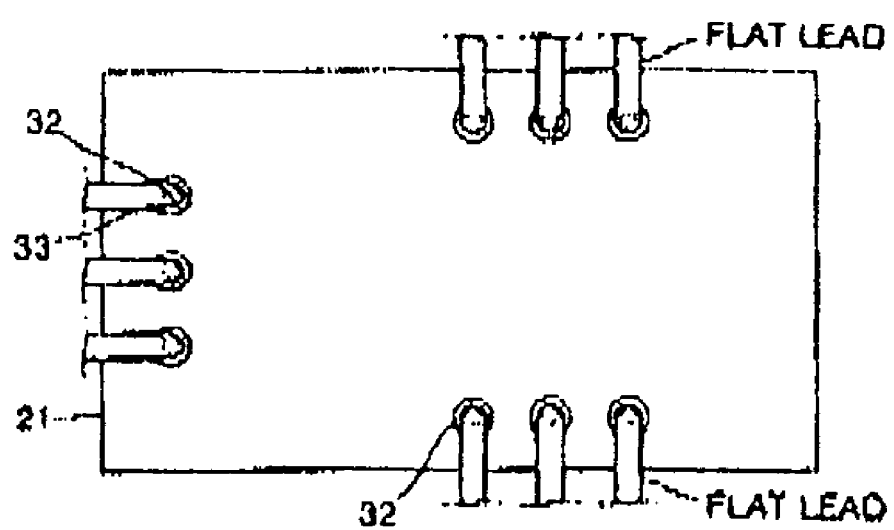
FIG. 3B is an illustrative, non-limiting embodiment of a flat lead.

FIGS. 3A and 3B illustrate rear views of the SMD type package according to the present invention shown in FIG. 2A. In FIGS. 3A and 3B, the SMD type package 21 according to the present invention includes a coaxial cable 32 and, a transition line 33

FIG. 3A is an illustrative, non-limiting embodiment of a ball grid array (BGA) SMD type package, and FIG. 3B is an illustrative, non-limiting embodiment of a flat lead SMD type package. Unlike a conventional butterfly-type package in which signal transfer lines protrude from a side to the outside, in the SMD type package according to the present invention, the coaxial cables connected to the transmission lines can protrude from any part of the package, due to the improved method of manufacturing the package. As depicted in FIG. 3A, A Ball Grid Array is formed on the outer surface of coaxial cables.

The SMD type package is precisely mounted on the PCB by a BGA bonding or flip chip bonding, but not by soldering. The BGA bonding is used for the BGA SMD type package shown in FIG. 3A, and the flip chip bonding is used for the flat lead SMD type package shown in FIG. 3B.

A method of manufacturing an SMD type package using coaxial cables according to the present invention will now be described.

The SMD type package using coaxial cables according to the present invention is manufactured by a low temperature co-fired ceramic (LTCC) process. The LTCC process forms a substrate by simultaneously heating ceramic and metal at a low temperature of about 800 to 1000° C. The process will be described in more detail herein below.

Specifically, glass having a low melting point and ceramic are mixed for forming a green sheet having an appropriate dielectric constant, and a conductive paste formed of silver or copper is printed and stacked on the green sheet so that the substrate is formed. Then, inactive devices such as a capacitor, a resister, and an inductor are installed in the substrate. Accordingly, a device having high integration density, reduced size and weight, and high reliability can be formed.

A method for applying the LTCC process to the present invention will be described herein below with reference to FIGS. 4A and 4B.

Figure 4A:
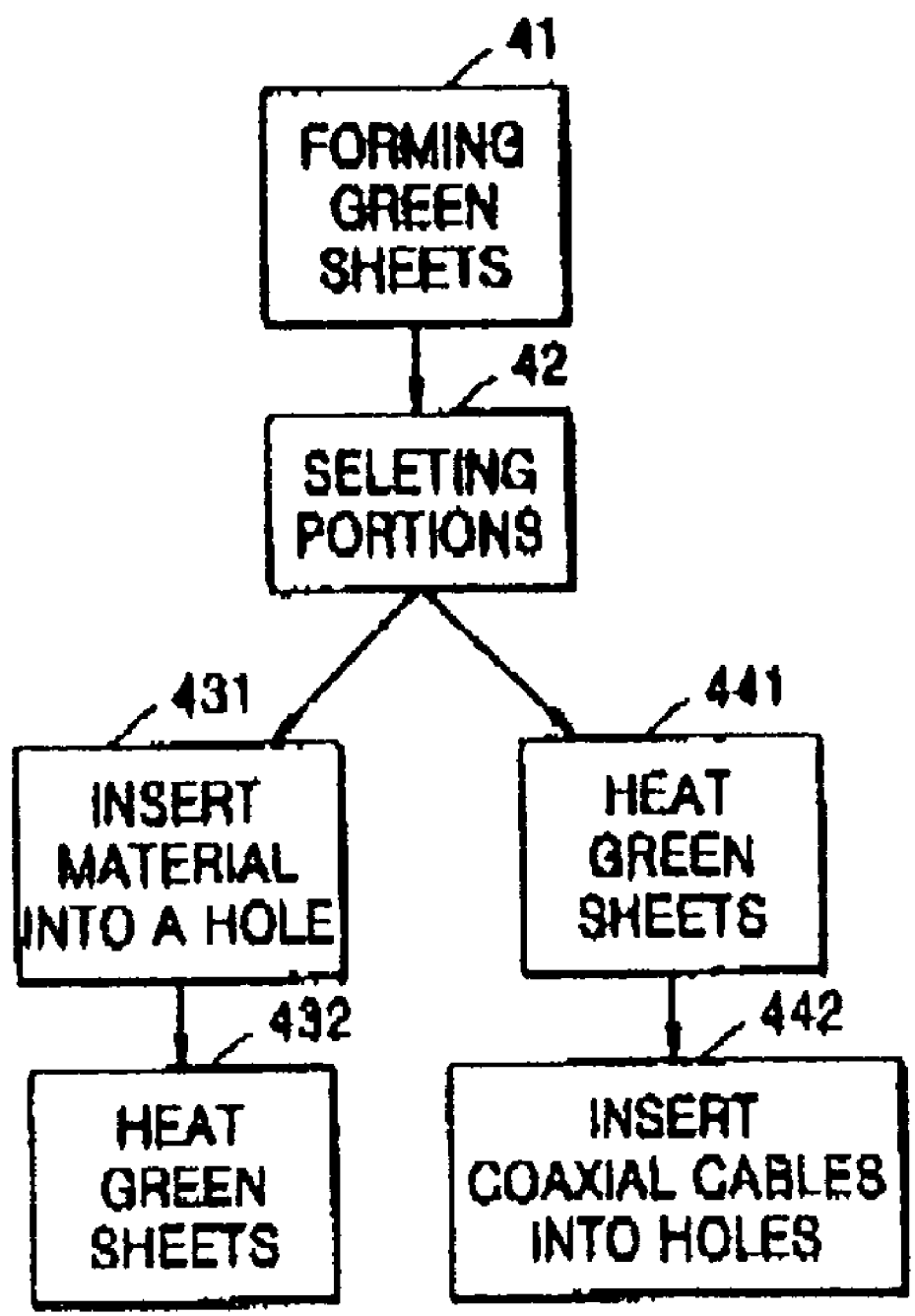
FIGS. 4A and 4B are flow diagrams of a method for manufacturing a surface mounted device (SMD) type package using an LTCC process according to an illustrative, non-limiting embodiment of the present invention.
Figure 4B:
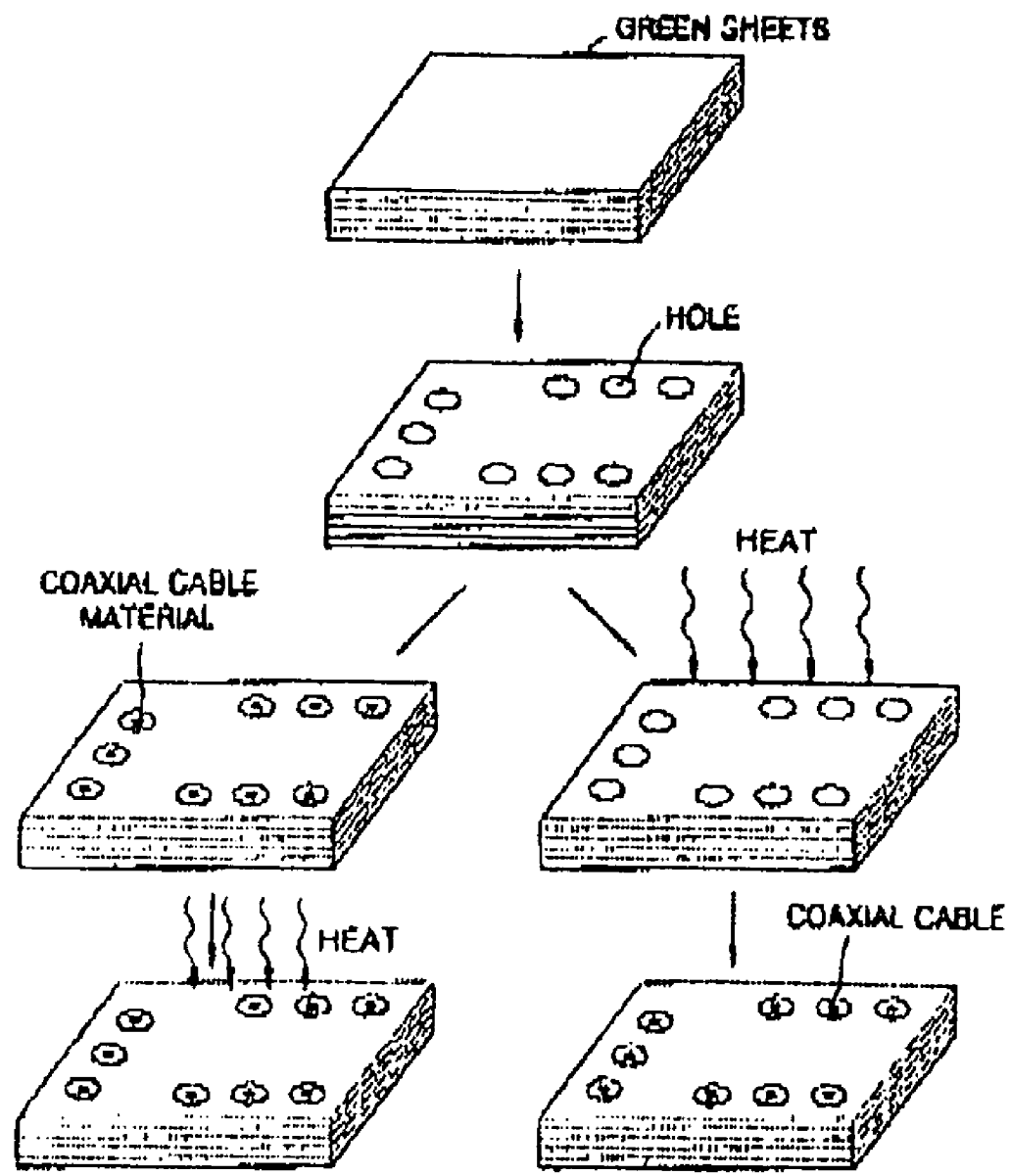

FIGS. 4A (at step 41) and 4B illustrate forming green sheets. After the green sheets are provided, portions for installing coaxial cables are selected on these green sheets at step 42 depicted in FIG 4A for forming holes on the chosen portions. In FIG 4B, this step is depicted with the stack of green sheets obtaining holes. FIGS. 4A (at step 431) and 4B further illustrates that a dielectric material and a conductive material are inserted into each hole on the green sheets. Next, as illustrated in FIGS. 4A (at step 432) and 4B, the green sheets are heated to form coaxial cable structures around the holes on these green sheets. Alternatively, as depicted in FIGS. 4A (steps 441 and 442) and 4B, the green sheets may first be heated and then have the coaxial cables inserted into the formed holes. In this illustrative, non-limiting embodiment, the green sheets are heated at the same temperature used in the conventional LTCC process. If the green sheets are heated at a temperature higher than the heating temperature in the conventional LTCC process, then it is difficult to form the conductive material in the coaxial cables.

According to the present invention, the SMT type package is formed to conveniently transfer high frequency signals without signal transfer loss. Moreover, since coaxial cables in the package are used as the signal transferring lines, the package has a large enough thermal capacity to be insensitive to the external temperature. The SMD type package according to the present invention is applied to various types of electronic devices including a SAW filter, an MMIC, or an HBT.

The above and other features of the invention including various and novel details of construction and combination of parts have been particularly described with reference to the accompanying drawings and pointed out in the claims. It will be understood that the particular construction and combination of parts embodying the invention is shown by way of illustration only and not as a limitation of the invention. The principles and features of this invention may be employed in varied and numerous embodiments without departing from the scope of the invention.

What is claimed is:

1. A method of manufacturing a surface mounted device package using coaxial cables, comprising:
    forming green sheets;
    selecting internal and external portions for mounting the coaxial cables on the green sheets and forming holes in the portions selected so as to connect the coaxial cables to an outside of the package at any desired location;
    stacking and heating the green sheets having the holes; and
    inserting the coaxial cables into the holes of the green sheets.

2. The method according to claim 1, wherein the coaxial cables are connected to transmission lines and are adapted to protrude from any portion of the package.

3. The method according to claim 1, further comprising bonding the package to a printed circuit board.

4. The method according to claim 1, wherein the coaxial cables transmit and receive high frequency signals, and wherein the coaxial cables comprise internal lead wires which contact transmission lines.

5. The method according to claim 1, wherein the coaxial cables are formed in a ball, and comprise exposed sections thereof on an external surface of the surface mounted device package, thereby performing bonding when attaching the coaxial cables to a printed circuit board.

6. The method according to claim 1, wherein the coaxial cables are formed in a flat lead, which is extended to an external surface of the surface mounted device package.

7. A method of manufacturing a surface mounted device (SMD) package using coaxial cables, comprising:
    forming green sheets;
    selecting portions for mounting the coaxial cables penetrating internal and external portions of the package, on the green sheets and forming holes in the portions selected;
    inserting dielectric material and conductive material into each hole on the green sheets; and
    stacking and heating the green sheets.

8. The method according to claim 7, wherein the coaxial cables are adapted to protrude to external portions of the package connected to transmission lines at any portion of the package, and wherein the coaxial cables protrude to the external portions of the package in accordance with the selection made.

* * * * *